United States Patent
Inoue et al.

Patent Number: 5,612,014
Date of Patent: Mar. 18, 1997

[54] COMPOUND SEMICONDUCTOR CRYSTAL

[75] Inventors: Tetsuya Inoue; Yoshiaki Hagi, both of Hyogo, Japan

[73] Assignee: Sumitomo Electric Industries, Ltd., Osaka, Japan

[21] Appl. No.: 509,384

[22] Filed: Jul. 31, 1995

[30] Foreign Application Priority Data

Aug. 10, 1994 [JP] Japan .................................. 6-188524
Dec. 5, 1994 [JP] Japan .................................. 6-300724

[51] Int. Cl.$^6$ ............................................... C01G 101/04
[52] U.S. Cl. .............................. 423/417; 117/2; 117/937; 437/100
[58] Field of Search ............................... 117/2, 3, 84, 89, 117/93, 928, 937; 423/291, 417; 437/100

[56] References Cited

U.S. PATENT DOCUMENTS 5,463,978 11/1995 Larkin et al. .............................. 117/89

FOREIGN PATENT DOCUMENTS 52-62200 5/1977 Japan .
3-57079 8/1991 Japan .
4-367589 12/1992 Japan .

*Primary Examiner*—R. Bruce Breneman
*Assistant Examiner*—Felisa Garrett
*Attorney, Agent, or Firm*—W. G. Fasse; W. F. Fasse

[57] ABSTRACT

A compound semiconductor crystal has a reduced dislocation density reduced. The compound semiconductor crystal doped with an impurity satisfies the following relations, wherein c.c. represents its carrier concentration and η represents its activation factor:

$$\eta \leq c.c./(7.8 \times 10^{15}) \quad (1)$$

$$\eta \leq (10/19) \times (197 - 2.54 \times 10^{-17} \times c.c.) \quad (2)$$

$$\eta \geq c.c./(3.6 \times 10^{16}) \quad (3)$$

A method which can prepare a compound semiconductor crystal doped with an impurity and having a prescribed carrier concentration with excellent reproducibility comprises the steps of melting a raw material for the compound semiconductor crystal in a crucible, and controllably cooling raw material melt, making thereby growing a crystal. The time required for cooling the raw material melt from the melting point T of the raw material to 2/3T is so controlled as to adjust the carrier concentration to a prescribed level.

20 Claims, 2 Drawing Sheets

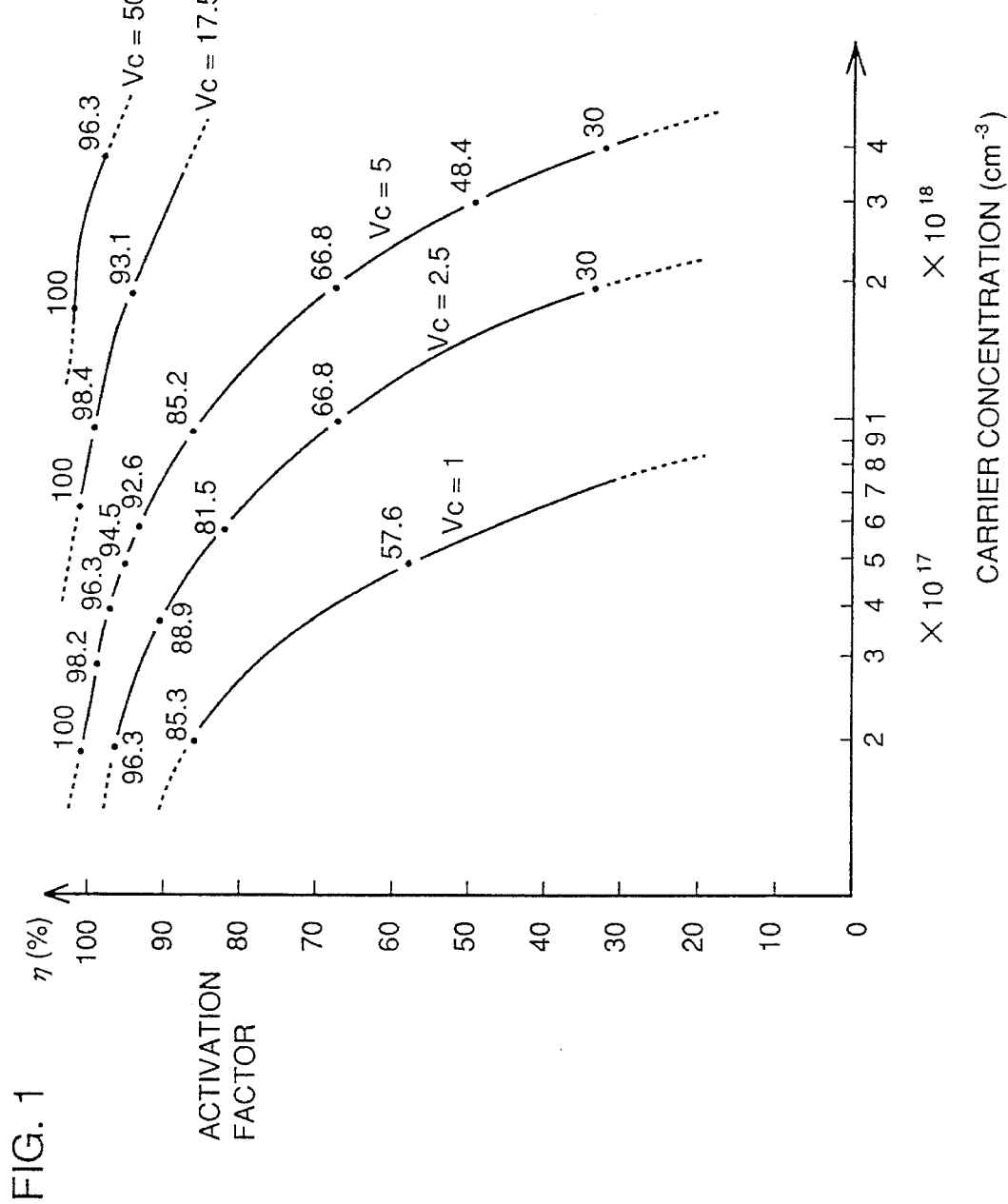

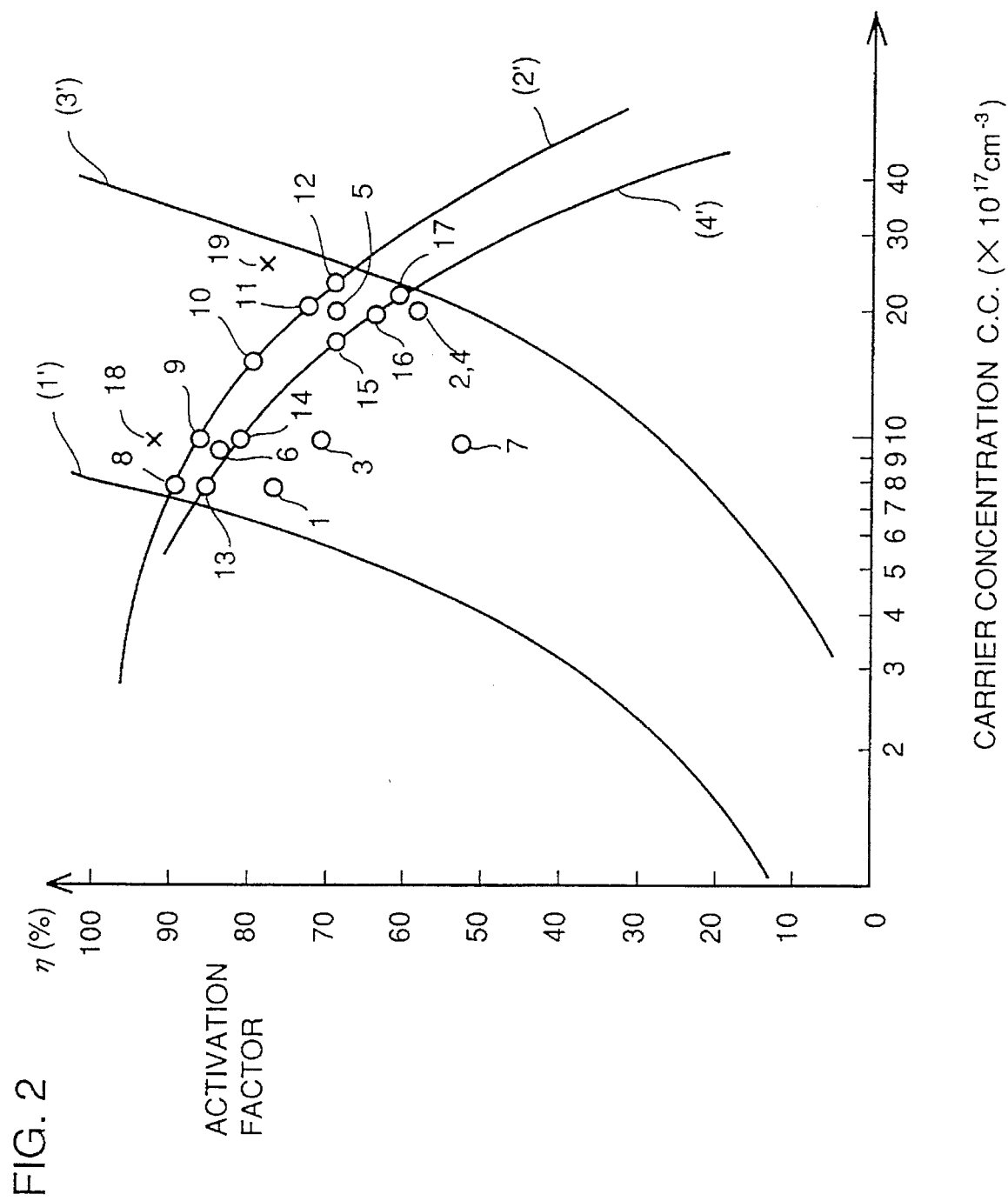

COMPOUND SEMICONDUCTOR CRYSTAL

BACKGROUND OF THE INVENTION

1. Field of the Invention

The present invention relates to a method of preparing a compound semiconductor crystal, and more particularly, it relates to a compound semiconductor crystal which is employed as a substrate for fabricating optical devices such as LEDs or laser diodes, or ICs, and a method of preparing the same.

2. Description of the Background Art

It is known in the art that compound semiconductor crystals of n-type GaAs or the like which are to be employed as substrates, for example, are prepared by various industrial methods such as a horizontal Bridgman method (HB method), a liquid encapsulated Czochralski pulling method (LEC method) which is disclosed in Japanese Patent Laying-Open No. 3-57079 (1991), a vertical Bridgman method (VB method) and a vertical temperature gradient freeze method (VGF method).

Among these methods, a vertical boat method, i.e. the VB or VGF method, is regarded as a promising method which can prepare a high-quality crystal having a lower defect density as compared with the other above mentioned methods at a low cost.

In relation to such a vertical boat method, i.e. the VB or VGF method, Japanese Patent Laying-Open No. 4-367589 (1992), for example, discloses a method of preparing a GaAs crystal while using a $B_2O_3$ encapsulant.

In preparing of a compound semiconductor crystal by the vertical boat method, first a seed crystal is arranged on a bottom portion of a crucible and a raw material solid is arranged thereon. Then, the raw material solid is entirely melted while an upper portion of the seed crystal is also melted. Then, the raw material melt as formed is cooled so as to be solidified upwardly from the seed crystal, thereby growing a single crystal.

However, a compound semiconductor substrate which is obtained by the aforementioned vertical boat method is still to be improved in consideration of its dislocation density. This is because the dislocation density must be further reduced if such a compound semiconductor crystal substrate is to be applied to fabrication of optical devices or ICs, due to influence exerted on the yield of elements which are obtained from a single substrate and the life time of the devices as formed.

In general, it is impossible to stably obtain an Si doped GaAs single crystal having a prescribed carrier concentration by the aforementioned vertical boat method by introducing Si into the crystal to attain a constant Si concentration. This is because an activation factor is not controlled in general. In the case of an Si concentration of $5 \times 10^{17}$ atoms/cm$^3$, for example, the carrier concentration is $0.5 \times 10^{17}$/cm$^3$ if the activation factor is 10%, while the former is $4 \times 10^{17}$/cm$^3$ if the latter is 80%.

Consequently, a number of defective elements result from industrial preparation of compound semiconductor crystals having prescribed carrier concentrations, and hence the preparation cost is disadvantageously increased.

SUMMARY OF THE INVENTION

An object of the present invention is to provide a compound semiconductor crystal substrate whose dislocation density is further reduced, by solving the aforementioned problem.

Another object of the present invention is to provide a method which can prepare a compound semiconductor crystal having a prescribed carrier concentration with excellent reproducibility, by solving the aforementioned problem.

According to an aspect of the present invention, a compound semiconductor crystal substrate is prepared. This compound semiconductor crystal substrate is a substrate consisting of a compound semiconductor crystal doped with an impurity, wherein the compound semiconductor crystal satisfies the following relations, assuming that c.c. represents its carrier concentration and η represents its activation factor:

$$\eta \leq c.c./(7.8 \times 10^{15}) \tag{1}$$

$$\eta \leq (10/19) \times (197 - 2.54 > 10^{-17} \times c.c.) \tag{2}$$

$$\eta \geq c.c./(3.6 \times 10^{16}) \tag{3}$$

Preferably, the compound semiconductor crystal further satisfies the following relation:

$$\eta \leq (10/19) \times (197 - 3.5 \times 10^{-17} \times c.c.) \tag{4}$$

Preferably, the compound semiconductor crystal is a group III–V compound semiconductor crystal. Further, the group III–V compound semiconductor crystal is preferably a gallium arsenide semiconductor crystal. Preferably, the doped impurity is at least one n-type impurity which is selected from the group of consisting of Si, S, Se, Ge, Te and Sn. Further, the compound semiconductor crystal preferably contains boron in a concentration of at least $1 \times 10^{16}$ atoms/cm$^3$ and not more than $6 \times 10^{18}$ atoms/cm$^3$. Preferably, the compound semiconductor crystal contains carbon in a concentration of not more than $5 \times 10^{14}$ atoms/cm$^3$.

While Japanese Patent Publication No. 52-62200 (1977) discloses relations between carrier concentrations and dislocation densities, the present inventors have prepared various GaAs compound semiconductor crystals having different carrier concentrations c.c. (cm$^{-3}$) and activation factors η (%) doped with Si as an impurity, and have measured the dislocation densities of the obtained crystals. Consequently, they have discovered that a crystal having a reduced dislocation density can be obtained when the above expressions (1), (2) and (3) are satisfied.

Namely, the inventors have noted that it is efficient for industrial production of a high-quality wafer to reduce the dislocation density by controlling the silicon (Si) concentration itself. According to the present invention, the carrier concentration of a wafer can be so controlled that an effect can be attained also when epitaxial wafers or devices are formed thereon.

The expressions (1) and (3) are decided or determined by the silicon (Si) concentration. The silicon concentration is insufficient to reduce the dislocation density if the expression (1) is not satisfied, while the silicon concentration is so excessive that deposition is disadvantageously caused if the expression (3) is not satisfied.

On the other hand, the expressions (2) and (4) are decided or determined by the boron (B) concentration. In a range satisfying the expression (2), it is conceivable that boron is partially activated as a p-type carrier, to reduce the dislocation density of the crystal as the result. When the expression (4) is satisfied, further, it is conceivable that the dislocation density of the crystal is further reduced due to further increase of the p-type carrier concentration.

In this specification, the activation factor η (%) is expressed as follows:

$$\eta = \{(n-c.c.)-(p-c.c.)+(o-c.c.)\}/(\text{silicon concentration})$$

where n-c.c.: n-type carrier concentration by silicon or the like p-c.c.: p-type carrier concentration by boron and silicon or the like o-c.c.: carrier concentration by an impurity other than silicon and boron As clearly understood from the above expression, the activation factor η (%) is a value which is decided by balancing between the boron concentration and the silicon concentration.

According to another aspect of the present invention, a method of preparing a compound semiconductor crystal is provided. This method is adapted to prepare a compound semiconductor crystal doped with an impurity, and comprises the steps of melting a raw material for the compound semiconductor crystal in a crucible, and then cooling the raw material melt obtained by the melting so as to bring about crystal growth. A time required for cooling the raw material melt from the melting point T of the raw material to 2/3T is so controlled as to adjust the carrier concentration to a prescribed level in the cooling step.

Preferably, the control of the time required for cooling and the adjustment of the prescribed carrier concentration are carried out on the basis of the following expression:

$$\eta = f(c.c., Vc) = 100 \times [19.7/19 - \{3.5/(3.8 \times 10^{18}) \times (c.c./Vc)\}] \quad (5)$$

where c.c. represents the carrier concentration (cm$^{-3}$), η represents the activation factor (%), and Vc represents a crystal cooling rate (° C./H) for cooling the melt from the melting point T (the absolute temperature) to 2/3T, η ≦ 100, and $1 \times 10^{17} \leq c.c. \leq 4 \times 10^{19}$. More preferably, $2 \times 10^{17} \leq c.c. \leq 4 \times 10^{18}$ in relation to the carrier concentration c.c.

Preferably, the compound semiconductor crystal is a group III–V compound semiconductor crystal. Further, the group III–V compound semiconductor crystal is preferably a gallium arsenide semiconductor crystal.

Preferably, the doped impurity is an n-type impurity which is selected from the group of consisting of Si, Te, S and Sn. In this case, an electrically neutral impurity such as indium (In), for example, may also be contained in the crystal with no influence on the effect of the present invention.

The inventors have discovered that there is a relation expressed in the following equation (5) between the carrier concentration c.c. (cm$^{-3}$), the crystal cooling rate Vc (° C./H) for cooling the melt from the melting point T to 2/3T and the activation factor η (%) in growing an impurity doped compound semiconductor crystal by the vertical boat method:

$$\eta = f(c.c., Vc) = 100 \times [19.7/19 - \{3.5/(3.8 \times 10^{18}) \times (c.c./Vc)\}] \quad (5)$$

where η ≦ 100 and $1 \times 10^{17} \leq c.c. \leq 4 \times 10^{19}$.

According to the present invention, it is possible to control the activation factor by controlling the time required for cooling the raw material melt from the melting point T of the raw material to 2/3T. Thus, it is possible to adjust the carrier concentration to a prescribed level as the result.

FIG. 1 illustrates relations between carrier concentrations c.c. and activation factors η as to crystal cooling rates Vc of 1, 2.5, 5, 17.5 and 50° C./H respectively along with the expression (1). Referring to FIG. 1, the abscissa axis of abscissas shows the carrier concentrations c.c. (×10$^{18}$ cm$^{-3}$), and the ordinate axis shows the activation factors η (%).

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates relations between carrier concentrations and activation factors at various crystal cooling rates; and FIG. 2 illustrates relations between carrier concentrations and activation factors in Si doped GaAs single crystals grown in Experiment 1.

DETAILED DESCRIPTION OF THE PREFERRED EMBODIMENTS AND OF THE BEST MODE OF THE INVENTION

An effect of the present invention in relation to a compound semiconductor crystal is now described with reference to Experiments 1 to 3.

(Experiment 1)

19 types of Si doped GaAs single crystals 80 to 90 mmφ in diameter were grown by a vertical boat method, as follows. First, a seed crystal was arranged in a crucible of pyrolytic boron nitride (pBN), and GaAs polycrystalline raw material melts were charged thereon in amounts shown in Table 1. Then, necessary amounts of Si and $B_2O_3$ encapsulant were charged into the crucibles in order to control silicon and boron concentrations, and thereafter the crucibles were set on a lower shaft of a furnace. Crystals were grown by cooling in a temperature distribution having a temperature gradient necessary for solidifying the crystals, at a relative movement speed of 4 mm/H for the crucibles.

TABLE 1

| No. | | Amount of Charged GaAs Crystal of 80 to 90 mmφ | Product Mass | Fraction Solidified g = 0.1 Carrier Concentration | Silicon Concentration | Activation Factor η (%) | EPD (cm$^{-2}$) | Boron Concentration | Carbon Concentration |
|---|---|---|---|---|---|---|---|---|---|
| Inventive Sample | 1 | 5,000 | 3,200 | $8 \times 10^{17}$ | $1 \times 10^{18}$ | 80 | 300 | $1.3 \times 10^{18}$ | $\leq 5 \times 10^{14}$ |
| | 2 | 5,000 | 2,900 | $2 \times 10^{18}$ | $3.3 \times 10^{18}$ | 61 | 210 | $6 \times 10^{18}$ | — |
| | 3 | 10,000 | 7,400 | $1 \times 10^{18}$ | $1.4 \times 10^{18}$ | 74 | 470 | $2.1 \times 10^{18}$ | — |
| | 4 | 10,000 | 5,800 | $2 \times 10^{18}$ | $3.3 \times 10^{18}$ | 61 | 290 | $5 \times 10^{18}$ | $\leq 5 \times 10^{14}$ |
| | 5 | 5,000 | 2,600 | $2 \times 10^{18}$ | $2.8 \times 10^{18}$ | 72 | 1,100 | $3 \times 10^{18}$ | — |
| | 6 | 10,000 | 6,010 | $1 \times 10^{18}$ | $1.15 \times 10^{18}$ | 87 | 1,430 | $2.3 \times 10^{18}$ | $\leq 5 \times 10^{14}$ |
| | 7 | 5,000 | 2,530 | $1 \times 10^{18}$ | $1.8 \times 10^{18}$ | 56 | 50 | $1.8 \times 10^{18}$ | — |
| | 8 | 5,000 | 3,100 | $8 \times 10^{17}$ | $8.6 \times 10^{17}$ | 92.7 | 1,240 | $1.5 \times 10^{18}$ | — |
| | 9 | 5,000 | 2,230 | $1 \times 10^{18}$ | $1.1 \times 10^{18}$ | 90.0 | 1,110 | $2 \times 10^{18}$ | — |

TABLE 1-continued

| No. | | Amount of Charged GaAs Crystal of 80 to 90 mmφ | Product Mass | Fraction Solidified g = 0.1 | | Activation Factor η (%) | EPD (cm$^{-2}$) | Boron Concentration | Carbon Concentration |
|---|---|---|---|---|---|---|---|---|---|
| | | | | Carrier Concentration | Silicon Concentration | | | | |
| | 10 | 5,000 | 2,650 | $1.5 \times 10^{18}$ | $1.8 \times 10^{18}$ | 83.3 | 1,090 | $2.4 \times 10^{18}$ | — |
| | 11 | 5,000 | 1,990 | $2.0 \times 10^{18}$ | $2.6 \times 10^{18}$ | 76.7 | 1,000 | $3 \times 10^{18}$ | — |
| | 12 | 5,000 | 3,221 | $2.3 \times 10^{18}$ | $3.2 \times 10^{18}$ | 72.7 | 1,080 | $2.9 \times 10^{18}$ | — |
| | 13 | 5,000 | 2,660 | $8 \times 10^{17}$ | $9.0 \times 10^{17}$ | 88.9 | 450 | $1.6 \times 10^{18}$ | — |
| | 14 | 5,000 | 2,210 | $1 \times 10^{18}$ | $1.2 \times 10^{18}$ | 85.2 | 330 | $2.2 \times 10^{18}$ | — |
| | 15 | 5,000 | 2,350 | $1.7 \times 10^{18}$ | $2.3 \times 10^{18}$ | 72.4 | 260 | $2.7 \times 10^{18}$ | — |
| | 16 | 5,000 | 2,780 | $2 \times 10^{18}$ | $3.0 \times 10^{18}$ | 66.8 | 240 | $3.3 \times 10^{18}$ | — |
| | 17 | 5,000 | 3,840 | $2.2 \times 10^{18}$ | $3.5 \times 10^{18}$ | 63.2 | 10 | $4.0 \times 10^{18}$ | — |
| Comparative Sample | 18 | 5,000 | 3,500 | $1 \times 10^{18}$ | $1.05 \times 10^{18}$ | 95 | 4,400 | — | — |
| | 19 | 10,000 | 5,510 | $2.5 \times 10^{18}$ | $3.1 \times 10^{18}$ | 81 | 3,300 | — | $\leq 5 \times 10^{14}$ |

Product weights (g), carrier concentrations (cm$^{-3}$), silicon concentrations (atoms/cm$^3$), activation factors (%), dislocation densities EPD (cm$^{-2}$), boron concentrations (atoms/cm$^3$) and carbon concentrations (atoms/cm$^3$) were measured as to the GaAs crystals obtained in the aforementioned manner. Table 1 also shows the results.

FIG. 2 illustrates relations between the carrier concentrations and the activation factors. Referring to FIG. 2, the abscissa axis shows the carrier concentrations c.c. ($\times 10^{17}$ cm$^{-3}$), and the ordinate axis of shows the activation factors η (%).

Referring to FIG. 2, curves (1') to (4') represent the following expressions respectively:

$$\eta = c.c./(7.8 \times 10^{15}) \quad (1')$$

$$\eta = (10/19) \times (197 - 2.54 \times 10^{-17} \times c.c.) \quad (2')$$

$$\eta = c.c./(3.6 \times 10^{16}) \quad (3')$$

$$\eta (10/19) \times (197 - 3.5 \times 10^{17} \times c.c.) \quad (4')$$

The results of the samples Nos. 1 to 19 obtained in the aforementioned manner are plotted in FIG. 2.

It is clearly understood from Table 1 and FIG. 2 that a compound semiconductor crystal substrate whose dislocation density is further reduced can be obtained according to the present invention.

The carrier concentrations were measured by the Van der Pauw method under the following conditions:
Sample Size: 3 to 5 mm square chip
Sample Thickness: 100 to 2000 μm
Electrode: AuGe—Ni alloy
Magnetic Field: 3000 to 6000 Gausses
Current: 1 to 100 mA The silicon concentrations were measured with a graphite furnace atomic absorption spectrometer (GFAAS) in this Experiment. The silicon concentration can alternatively be measured with a secondary ion mass spectrometer (SIMS) or an inductively coupled plasma atomic emission spectrometer (ICP). The boron concentrations were measured with a glow discharge mass spectrometer (GDMS) in this Experiment. The boron concentration can alternatively be measured with an inductively coupled plasma atomic emission spectrometer (ICP). The carbon concentrations were measured with a Fourier transform infrared spectrometer (FTIR).

(Experiment 2)

The crystal of the sample No. 1 prepared in Experiment 1 was sliced and polished to prepare a 3-inch wafer of 350 μm thickness. This wafer exhibited a carrier concentration of $8 \times 10^{17}$ cm$^{-3}$ and a dislocation density EPD of 300 cm$^{-2}$. A first epitaxial layer was formed on this wafer by liquid phase epitaxy, and a second epitaxial layer was formed thereon to prepare an epitaxial wafer.

The first epitaxial layer was a layer consisting of n-GaAs to which Si was doped as an impurity and having a thickness of 40 to 80 μm. The second epitaxial layer was a layer consisting of p-GaAs to which Si was doped as an impurity and having a thickness of 30 to 120 μm and a carrier concentration of at least $1 \times 10^{18}$ cm$^{-1}$.

The epitaxial wafer obtained in this manner had an excellent surface, while a desired optical output was attained. Further, no wafer cracking was caused during the epitaxial growth. In addition, optical elements which were prepared from this epitaxial wafer exhibited an average life of 1.3 times as compared with the prior art.

(Experiment 3)

The crystal of the sample No. 2 prepared in Experiment 1 was sliced and polished to prepare a 3-inch wafer of 500 μm thickness. This wafer exhibited a carrier concentration of $2 \times 10^{18}$ cm$^{-3}$ and a dislocation density EPD of 210 cm$^{-2}$. A first epitaxial layer was formed on this wafer by vapor phase epitaxy, and a second epitaxial layer was formed thereon to prepare an epitaxial wafer.

The first epitaxial layer was a layer consisting of n-GaAs to which Si was doped as an impurity and having a thickness of 3 to 7 μm and a carrier concentration of at least $1 \times 10^{18}$ cm$^{-3}$. The second epitaxial layer was a layer consisting of n-GaAs to which Si was doped as an impurity and having a thickness of 0.3 to 0.5 μm and a carrier concentration of at least 1 to $2 \times 10^{17}$ cm$^{-3}$.

The epitaxial wafer obtained in this manner had a high-quality surface, and it was possible to attain desired electrical properties. Further, no wafer cracking was caused during the epitaxial growth. In addition, the yield of devices fabricated from this epitaxial wafer was improved to 72% as compared with that of 60% of the prior art.

While the above description relates to gallium arsenide semiconductor crystals, it is predictable that similar effects can also be attained as to other group III–V compound semiconductor crystals. Further, the doped impurity is not restricted to Si either and it is predictable that similar effects can also be attained when S, Se, Ge, Te, Sn and the like are doped.

As clearly understood from the above results of Experiments 1 to 3, it is possible to obtain a compound semiconductor crystal whose dislocation density is further reduced according to the present invention.

An effect of the present invention in relation to a method of preparing a compound semiconductor crystal is now described with reference to a further Example.

10 types of Si doped GaAs single crystals 80 to 90 mm$\phi$ in diameter were grown by a vertical boat method as follows. First, a seed crystal was arranged in crucibles of pyrolytic boron nitride (pBN), and GaAs polycrystalline raw materials were charged thereon in amounts shown in Table 2. Then, necessary amounts of Si and $B_2O_3$ encapsulants were charged into the crucibles, which in turn were placed in a furnace. Crystals were grown by cooling at relative movement speeds of 4 mm/H between a heater and the crucibles.

$10^{18}$, it is also predictable that the inventive effect can be attained in the range of $1\times10^{17} \leq c.c. \leq 4\times10^{19}$.

Further, a similar Experiment was carried out by employing GaAs polycrystalline raw materials containing Si and B and crucibles of high purity quartz, without using $B_2O_3$ encapsulants. Also in this case, it was possible to prepare Si doped GaAs crystals having prescribed carrier concentrations with excellent reproducibility.

The carrier concentrations were measured by the Van der Pauw method under the following conditions:
Sample Size: 3 to 5 mm square chip
Sample Thickness: 100 to 2000 μm
Electrode: AuGe—Ni alloy

TABLE 2

| Sample No. | Amount of Charged GaAs Crystal (g) | Product Mass (Single Crystal) (g) | Fraction Solidified g = 0.1 | | Activation Factor (%) | Crystal Cooling Rate Vc (°C./H) 1511 - 1511 × 2/3°K | Boron Concentration (atoms/cm³) | Carbon Concentration (Atoms/cm³) |
|---|---|---|---|---|---|---|---|---|
| | | | Carrier Concentration (cm⁻³) | Silicon Concentration (atoms/cm³) | | | | |
| 1 | 5,000 | 3,500 | $2 \times 10^{17}$ | $2 \times 10^{17}$ | 100 | 5 | $4 \times 10^{17}$ | — |
| 2 | 5,000 | 3,200 | $1 \times 10^{18}$ | $1.17 \times 10^{18}$ | 85.2 | 5 | $2 \times 10^{18}$ | — |
| 3 | 5,000 | 2,380 | $4 \times 10^{18}$ | $13.3 \times 10^{18}$ | 30.0 | 5 | $6 \times 10^{18}$ | — |
| 4 | 4,000 | 2,900 | $4 \times 10^{17}$ | $4.15 \times 10^{17}$ | 96.3 | 5 | — | — |
| 5 | 4,000 | 2,110 | $2 \times 10^{18}$ | $2.99 \times 10^{18}$ | 66.8 | 5 | — | — |
| 6 | 8,000 | 5,500 | $2 \times 10^{17}$ | $2.08 \times 10^{17}$ | 96.3 | 2.5 | — | — |
| 7 | 8,000 | 6,130 | $1 \times 10^{18}$ | $1.50 \times 10^{18}$ | 66.8 | 2.5 | $1.8 \times 10^{18}$ | — |
| 8 | 8,000 | 5,990 | $2 \times 10^{17}$ | $2.08 \times 10^{17}$ | 96.3 | 2.5 | $2.2 \times 10^{17}$ | $\leq 5 \times 10^{14}$ |
| 9 | 8,000 | 7,100 | $1 \times 10^{18}$ | $1.50 \times 10^{18}$ | 66.8 | 2.5 | $1.5 \times 10^{18}$ | $\leq 5 \times 10^{14}$ |
| 10 | 14,000 | 10,010 | $1 \times 10^{18}$ | $1.02 \times 10^{18}$ | 98.4 | 17.5 | $5 \times 10^{18}$ | $\leq 5 \times 10^{14}$ |

In the cooling step, prescribed carrier concentrations and silicon concentrations were set with reference to solidification factors of 0.1, activation factors were calculated from these values, and crystal cooling rates were obtained from the activation factors along with the above expression (1). Then the cooling step was carried out in each case at the calculated cooling rate.

Table 2 also shows the carrier concentrations c.c. (cm⁻³) and the silicon concentrations (atoms/cm³) as set, and the activation factors η (%) and the cooling rates Vc (° C./H) as calculated.

The term "cooling rate" indicates an average rate for cooling a raw material melt from the melting point T of the raw material to 2/3T, and it is not inevitably necessary that the rate is constant in this temperature zone. In this Example, the "cooling rates" indicate average rates in the step of cooling the raw material melts from 1511° K. i.e., the melting point of GaAs, to 1511×(2/3)° K.

On the other hand, the term "activation factor" indicates a value obtained by dividing the carrier concentration by the concentration of the impurity such as silicon.

Product weights (g), carrier concentrations (cm⁻³), silicon concentrations (atoms/cm³), boron concentrations (atoms/cm³) and carbon concentrations (atoms/cm³) were measured as to the GaAs crystals obtained in the aforementioned manner. Table 2 also shows the product weights, the boron concentrations and the carbon concentrations as obtained. Referring to Table 2, the carrier concentrations and the silicon concentrations are omitted since values substantially equal to the set values were obtained as to these concentrations.

From these results, it is understood possible to prepare an Si doped GaAs crystal having a prescribed carrier concentration in excellent reproducibility according to the present invention.

While the above Experiment was only carried out in the range of the carrier concentrations c.c. of $2\times10^{17} \leq c.c. \leq 4\times$ Magnetic Field: 3000 to 6000 Gausses
Current: 1 to 100 mA The silicon concentrations were measured with a graphite furnace atomic absorption spectrometer (GFAAS) in this Example. The silicon concentration can alternatively be measured with a secondary ion mass spectrometer (SIMS) or an inductively coupled plasma atomic emission spectrometer (ICP). The boron concentrations were measured with a glow discharge mass spectrometer (GDMS) in this Example. The boron concentration can alternatively be measured with an inductively coupled plasma atomic emission spectrometer (ICP). The carbon concentrations were measured with a Fourier transform infrared spectrometer (FTIR).

According to the present invention, as hereinabove described, it is possible to prepare a compound semiconductor crystal having a prescribed carrier concentration with excellent reproducibility by controlling a prescribed cooling rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compound semiconductor crystal containing a compound semiconductor material, a dopant impurity, boron in a concentration of at least $1\times10^{16}$ atoms/cm³ and not more than $6\times10^{18}$ atoms/cm³, and carbon in a concentration of not more than $5\times10^{14}$ atoms/cm³, and satisfying the following relations, wherein c.c. represents a carrier concentration of said crystal in cm⁻³ and η represents an activation factor of said crystal in %:

$\eta \leq c.c./(7.8\times10^{15})$, $\eta \leq (10/19)\times(197-2.54\times10^{-17}\times c.c.)$, and $\eta \geq c.c./(3.6\times10^{16})$.

2. The compound semiconductor crystal in accordance with claim 1, wherein said compound semiconductor material is a group III–V compound semiconductor material.

3. The compound semiconductor crystal in accordance with claim 2, wherein said group III–V compound semiconductor material is a gallium arsenide semiconductor material.

4. The compound semiconductor crystal in accordance with claim 1, wherein said dopant impurity is at least one n-type impurity selected from the group consisting of Si, S, Se, Ge, Te and Sn.

5. The compound semiconductor crystal in accordance with claim 1, wherein said dopant impurity is Si.

6. The compound semiconductor crystal in accordance with claim 5, wherein said compound semiconductor material is gallium arsenide.

7. The compound semiconductor crystal in accordance with claim 1, wherein said carrier concentration is in a range represented as:

$1\times10^{17} \leq c.c. \leq 4\times10^{19}$.

8. The compound semiconductor crystal in accordance with claim 1, wherein said carrier concentration is in a range represented as:

$2\times10^{17} \leq c.c. \leq 4\times10^{18}$.

9. The compound semiconductor crystal in accordance with claim 1, wherein said carrier concentration c.c. is at least $8\times10^{17}$ cm$^{-3}$.

10. The compound semiconductor crystal in accordance with claim 9, wherein said activation factor is at least 56%.

11. The compound semiconductor crystal in accordance with claim 1, wherein said activation factor is at least 56%.

12. The compound semiconductor crystal in accordance with claim 1, wherein said activation factor is at least 61%.

13. The compound semiconductor crystal in accordance with claim 1, wherein said carrier concentration has been set at a selected value by solidifying said crystal from a melt at a controlled cooling rate from a melting temperature T(K) of said crystal to 2/3T(K).

14. The compound semiconductor crystal in accordance with claim 13, wherein said controlled cooling rate is represented by Vc(K/Hour) to satisfy the following equation:

$\eta=100\times(19.7/19-\{3.5/(3.5\times10^{18})\times(c.c./Vc)\})$.

15. The compound semiconductor crystal in accordance with claim 1, wherein a content amount of said dopant impurity and a content amount of said boron are limited and balanced against one another to give said activation factor satisfying said relations.

16. The compound semiconductor crystal in accordance with claim 15, wherein said content amount of said dopant impurity is in a range from $1\times10^{18}$ cm$^{-3}$ to $3.3\times10^{18}$ cm$^{-3}$ and said content amount of said boron is in a range from $1.3\times10^{18}$ cm$^{-3}$ to $5\times10^{18}$ cm$^{-3}$.

17. A compound semiconductor crystal containing a compound semiconductor material, a dopant impurity, boron in a concentration of at least $1\times10^{16}$ atoms/cm$^3$ and not more than $6\times10^{18}$ atoms/cm$^3$, and carbon in a concentration of not more than $5\times10^{14}$ atoms/cm$^3$, and satisfying the following relations, wherein c.c. represents a carrier concentration of said crystal in cm$^{-3}$ and $\eta$ represents an activation factor of said crystal in %:

$\eta \leq c.c./(7.8\times10^{15})$, $\eta \leq (10/19)\times(197-3.5\times10^{-17}\times c.c.)$, and $\eta \geq c.c./(3.6\times10^{16})$.

18. The compound semiconductor crystal in accordance with claim 17, wherein said compound semiconductor material is a group III–V compound semiconductor material.

19. The compound semiconductor crystal in accordance with claim 18, wherein said group III–V compound semiconductor material is a gallium arsenide semiconductor material.

20. The compound semiconductor crystal in accordance with claim 17, wherein said dopant impurity is at least one n-type impurity selected from the group consisting of Si, S, Se, Ge, Te and Sn.

* * * * *

UNITED STATES PATENT AND TRADEMARK OFFICE
CERTIFICATE OF CORRECTION

PATENT NO. : 5,612,014
DATED : Mar. 18, 1997
INVENTOR(S) : Inoue et al.

It is certified that error appears in the above-identified patent and that said Letters Patent is hereby corrected as shown below.

On the Title Page:
In [57] ABSTRACT: line 2, delete "reduced";
　　　　　　　　　line 13, after "cooling" insert --the obtained--;
　　　　　　　　　line 14, delete "making".
Col. 1, line 31, delete "of".
Col. 4, line 11, after "the" insert --corresponding above--;
　　　line 12, replace "(1)." by --(5).--, delete "of";
　　　line 13, delete "abscissas".
Col. 5, line 28, delete "of".
Col. 8, line 1, delete "also".
Col. 10, Claim 14, line 5, cancel the line and replace to read:
　　　　　　　　$--\eta=100\times(19.7/19-\{3.5/(3.8\times10^{18})\times(c.c./Vc)\}).--$.

Signed and Sealed this

Second Day of September, 1997

*Attest:*

BRUCE LEHMAN

*Attesting Officer*　　*Commissioner of Patents and Trademarks*